United States Patent
Mori

(12) United States Patent     (10) Patent No.: US 7,789,488 B2
(45) Date of Patent: Sep. 7, 2010

(54) FLEXIBLE WIRING BOARD AND LIQUID DISCHARGE HEAD

(75) Inventor: Toshihiro Mori, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 963 days.

(21) Appl. No.: 11/243,294

(22) Filed: Oct. 3, 2005

(65) Prior Publication Data
US 2006/0071971 A1    Apr. 6, 2006

(30) Foreign Application Priority Data
Oct. 6, 2004    (JP)   ............... 2004-293194

(51) Int. Cl.
*B41J 2/14*    (2006.01)
*B41J 2/05*    (2006.01)

(52) U.S. Cl. ........................... 347/50; 347/58

(58) Field of Classification Search .................. 347/50, 347/58, 63, 20
See application file for complete search history.

(56) References Cited

U.S. PATENT DOCUMENTS

| | | | |
|---|---|---|---|
| 6,471,901 B1 | 10/2002 | Kawamura | |
| 6,877,839 B2 | 4/2005 | Kawamura | |
| 2005/0128548 A1 * | 6/2005 | Kashino et al. | ............. 359/205 |

FOREIGN PATENT DOCUMENTS

| | | | |
|---|---|---|---|
| JP | 05-275498 | | 10/1993 |
| JP | 2001-130001 | | 5/2001 |
| JP | 2002-331667 | * | 11/2002 |
| JP | 2002-331667 A | | 11/2002 |
| JP | 2004-234803 | * | 8/2004 |

* cited by examiner

*Primary Examiner*—Stephen D Meier
*Assistant Examiner*—Geoffrey Mruk
(74) *Attorney, Agent, or Firm*—Canon U.S.A., Inc. I.P. Division

(57) ABSTRACT

In an ink jet recording head including a flexible wiring board, the flexible wiring board has a thickness reduction part formed by reducing a film thickness of a part of the base film. The thickness reduction part is configured to alleviate stress applied to inner leads by a base film in the periphery of a device hole, so as to avoid the failure of bonding or the like caused by the inner leads of the flexible wiring board, on which a recording element substrate is installed.

1 Claim, 11 Drawing Sheets

DIRECTION OF MOVEMENT CAUSED BY THERMAL EXPANSION

DIRECTION OF MOVEMENT CAUSED BY CONTRACTION

FLEXIBLE WIRING BOARD AND LIQUID DISCHARGE HEAD

BACKGROUND OF THE INVENTION

1. Field of the Invention

The present invention relates to a flexible wiring board used in a liquid discharge head or the like mounted on a recording device such as an ink jet printer, and to the liquid discharge head.

2. Description of the Related Art

With respect to a method for installing a liquid discharge element substrate for a liquid discharge head mounted on an ink jet printer or the like, a connection method is known in which a flexible wiring board is superimposed on the liquid discharge element substrate to perform inner lead bonding (ILB), as disclosed in Japanese Patent Application Laid-Open No. 2001-130001.

FIG. 10 is a diagram illustrating the ILB according to a conventional example. An electric wire tape 120, which is the flexible wiring board, uses a base film 121 configured of an insulating material such as polyimide or the like as a substrate. On the base film 121, a sprocket hole (not shown) for locating a film transfer position and a device hole 122, which is an opening for inserting a recording element substrate 101 (101a, 101b) therein, are formed. To the surface of the base film 121, conductive metal foil such as copper foil or the like is attached. This metal foil is patterned into a desired shape using a photolithography technique, and wiring such as an inner lead 123 projected into the device hole 122 and an outer lead (not shown) are formed thereon. The surface of the metal foil after the patterning operation is subjected to plating treatment of, for example, gold, tin, solder or the like, and further, an area where a metal surface should not be exposed is covered with a protective layer of a resist, for example.

When the inner lead 123 of the electric wire tape 120 and an electrode pad 102 of the recording element substrate 101 are electrically connected, a bump 103, which is a projection of metal, is provided beforehand on the electrode pad 102 of the recording element substrate 101. Then, the inner lead 123 to be connected is positioned right above the bump 103, and the inner lead 123 is bonded to the bump 103 from the upper part of the inner lead 123 using a bonding tool. At this time, the recording element substrate 101 is fixed on a bonding stage by vacuum adsorption or on a secure support 110 by an adhesive or the like so as to obtain an excellent bonding state.

Normally, such ILB methods are, broadly speaking, divided into two methods. One is a gang bonding method in which an entire inner lead and bump are connected in a lump with the bonding tool for each recording element substrate. Another method is a single point bonding method in which the inner lead and the bump are connected separately, selectively, and successively, one after another. In either method, in bonding the inner lead and the bump, the bonding tool has to be heated to a relatively high temperature. Generally, in the single point bonding method, the heat is applied to a temperature of approximately 200° C. When the bonding is performed by the gang bonding method, the bonding tool is required to be heated to a high temperature of approximately 500° C.

As described above, the bonding between the bump 103 and the inner lead 123 is performed by the application of heat in a high temperature condition. Accordingly, the base film 121, mainly composed of an insulating organic resin such as polyimide or the like, and the inner lead 123, mainly composed of copper (Cu), are bonded to the bump 103 in a thermally expanded state. In particular, the thermal expansion of the base film 121 is larger than the inner lead 123, and thus, in the vicinity of a heating spot shown in FIG. 10, the base film 121 expands in a direction of widening the device hole 122 as indicated by an arrow A. After bonding, in a cooling process in which the electric wire tape 120 is separated from the bonding tool, discharged from a heating stage, and cooled to an ambient temperature, the electric wire tape 120 contracts so as to narrow the device hole 122 from the thermally expanded state to a normal state as indicated by an arrow B shown in FIG. 10. As a result, stress is applied to a bonding section between the inner lead 123 and the bump 103. The stress is affected by the volume of the base film 121. When the stress exceeds bonding strength between the electrode pad 102 and the bump 103 or between the bump 103 and the inner lead 123, a peeling phenomenon occurs at the bonding section.

In particular, in the case of an ink jet recording head (liquid discharge head) in which, for example, a color recording element substrate 101a and a black recording element substrate 101b are installed in a piece of the electric wire tape 120 as shown in FIG. 10, this phenomenon occurs for the reason described next.

An impact precision of a droplet, such as ink or the like, discharged from the recording element substrates 101a and 101b determines recording quality. Therefore, for example, two recording element substrates 101a and 101b for color and black are required to be fixed on the support 110 at a highly accurate position. Therefore, if the inner lead 123 of the electric wire tape 120 and the electrode pad 102 of each recording element substrate 101 are connected beforehand and then fixed on the support 110, each of two recording element substrates 101a and 101b is moved relative to an appropriate position after completion of the connection. In this step, the above-described ILB bonding section can be broken.

Accordingly, in a process for manufacturing the ink jet recording head, a method to be employed is to fix each recording element substrate 101 on the support 110 in an accurate position beforehand. Thereafter, the positioning is accurately performed so as to connect the inner lead 123 of the electric wire tape 120 and the electrode pad 102 of each recording element substrate 101, and in this state, the ILB is performed.

FIGS. 11A to 11D illustrate a state in which stress is applied to the ILB bonding section in such configuration. As shown in FIG. 11A, the electric wire tape 120 and the recording element substrate 101 are securely fixed on the support 110 in a highly accurate position to each other. During the ILB operation, heating is carried out in this state, and this causes a difference in thermal expansion between the recording element substrate 101, mainly composed of Si, and the base film 121 of the electric wire tape 120, mainly composed of polyimide. As a result, the inner lead 123 pasted on the base film 121 having a larger thermal expansion amount moves from the electrode pad 102, which was accurately positioned in an initial condition. Accordingly, as shown in FIG. 11B, a reciprocal deviation from the initial position occurs. Thus, practical bonding using the bonding tool is performed in a state deviating from the initial position as shown in FIG. 11C with a nick mark 122a.

After completion of the bonding, the base film 121 and the inner lead 123 are discharged from the heating stage and are cooled to an ambient temperature. Then, the base film 121 and the inner lead 123 contract, and are urged to return to the initial stage as shown in FIG. 11D. The whole stress generated at this time is applied to the bonding section, which is subjected to the ILB, thus in the worst case, the bonding section is broken.

With respect to a tape carrier used for packaging a general semiconductor chip, for example, Japanese Patent Application Laid-Open No. 5-275498 discloses a method in which for the purpose of preventing the failure of the packaging caused by thermal expansion, a notch part is formed on each corner of the device hole to divide the surrounding of the inner lead.

Japanese Patent Application Laid-Open No. 5-275498 discloses the tape carrier which is scrapped after completing the connection of the inner lead. Therefore, even if the surrounding of the device hole is notched, no problem arises. However, in the case of the flexible wiring board, if the notch part or the like is formed on the surrounding of the device hole, the wiring cannot be carried out in this area. Accordingly, the size of the flexible wiring board increases. Further, when the flexible wiring board on which the notch part or the like is formed is installed on the recording element substrate of the ink jet recording head, there is concern that an electrical shorting between adjacent wires, or the corrosion of the wire or the like, can be caused by a liquid such as ink entering the notch part. As a measure against this, additional processes or treatment for protecting the exposed portion of a wire are further required.

SUMMARY OF THE INVENTION

The present invention is directed to a flexible wiring board and a liquid discharge head which are capable of effectively preventing peeling or the like of a bonding section due to stress caused by a difference in thermal expansion, without causing an increase in the size of the flexible wiring board and the failure of wiring such as an electrical short circuit or the like The present invention is also directed to a flexible wiring board and a liquid discharge head which are capable of reducing stress applied to an inner lead bonding section of the flexible wiring board and preventing the failure of installation such as peeling or the like on the inner lead bonding section.

In one aspect of the present invention, a flexible wiring board includes a base film, at least one device hole provided on the base film, a plurality of wiring parts formed on a surface of the base film, a plurality of inner leads formed by extending ends of the plurality of wiring parts in an opening of the device hole, and a protective layer protecting the plurality of wiring parts, wherein the base film has a thickness reduction part formed by reducing a film thickness of a part of the base film. The thickness reduction part is configured to alleviate stress applied to the plurality of inner lead in a periphery of the device hole.

In another aspect of the present invention, a liquid discharge head includes the flexible wiring board.

Further features of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE EMBODIMENTS

Embodiments of the invention will be described in detail below with reference to the drawings.

Figure 1:
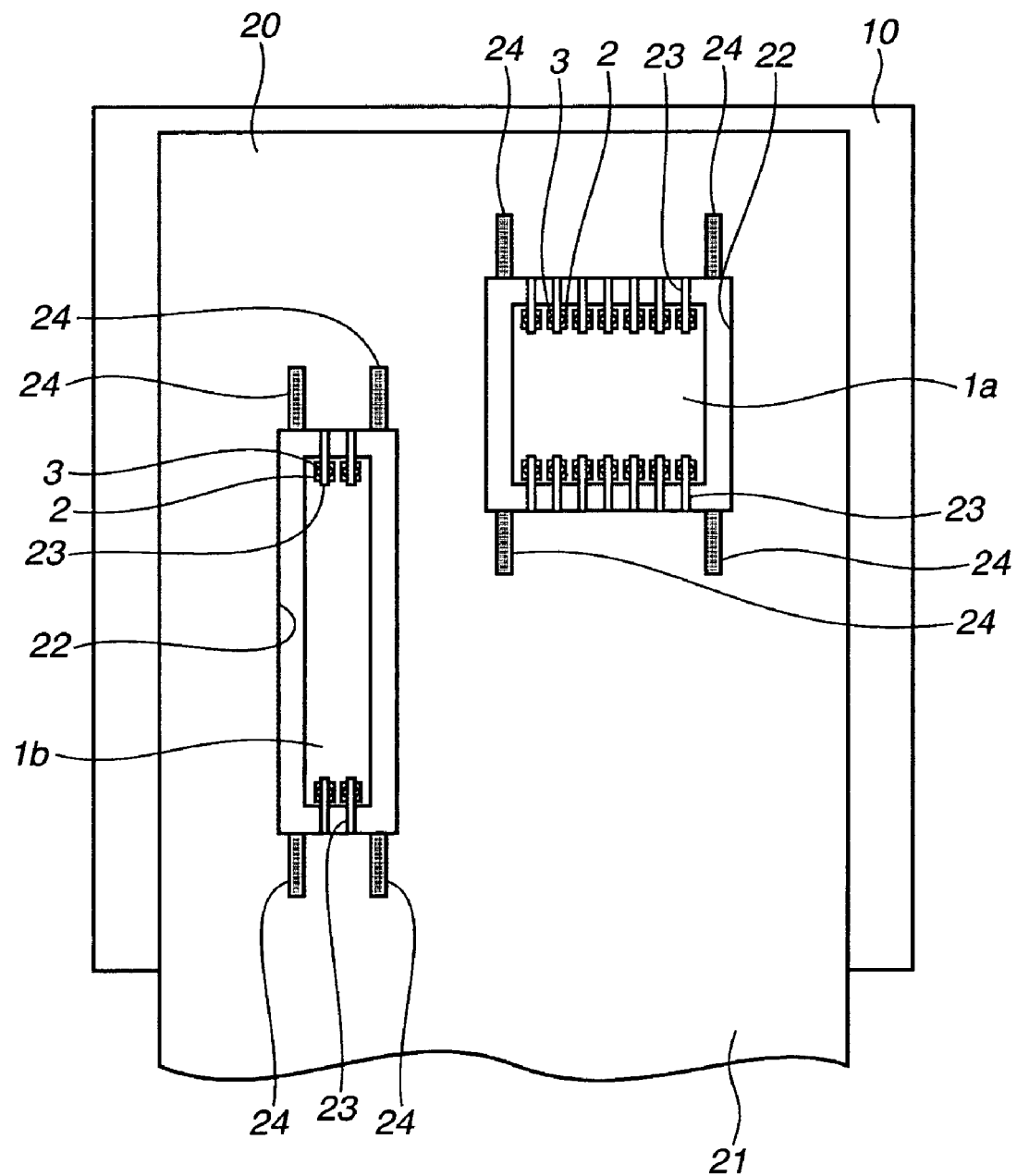
FIG. 1 is a schematic plan view showing an electric wire tape and a recording element substrate installed on the electric wire tape according to the first embodiment of the present invention.

First, as represented in FIG. 1, on a base film 21 of a flexible wiring board (electric wire tape 20), a half-cut notch 24 is formed in an area where inner leads 23 projected into a device hole 22 are arranged or in an area in the vicinity thereof. This half-cut notch 24 forms a thickness reduction part of low stiffness in which the film thickness of the base film 21 is locally thinned. By providing such a low stiff part, the displacement of the inner lead 23 caused by thermal expansion during bonding ILB is absorbed, and the peeling phenomenon at a bonding section between recording element substrates 1a and 1b and the inner lead 23 is avoided. The recording element substrates 1a and 1b are discharge element substrates installed on the electric wire tape 20.

Figure 2:
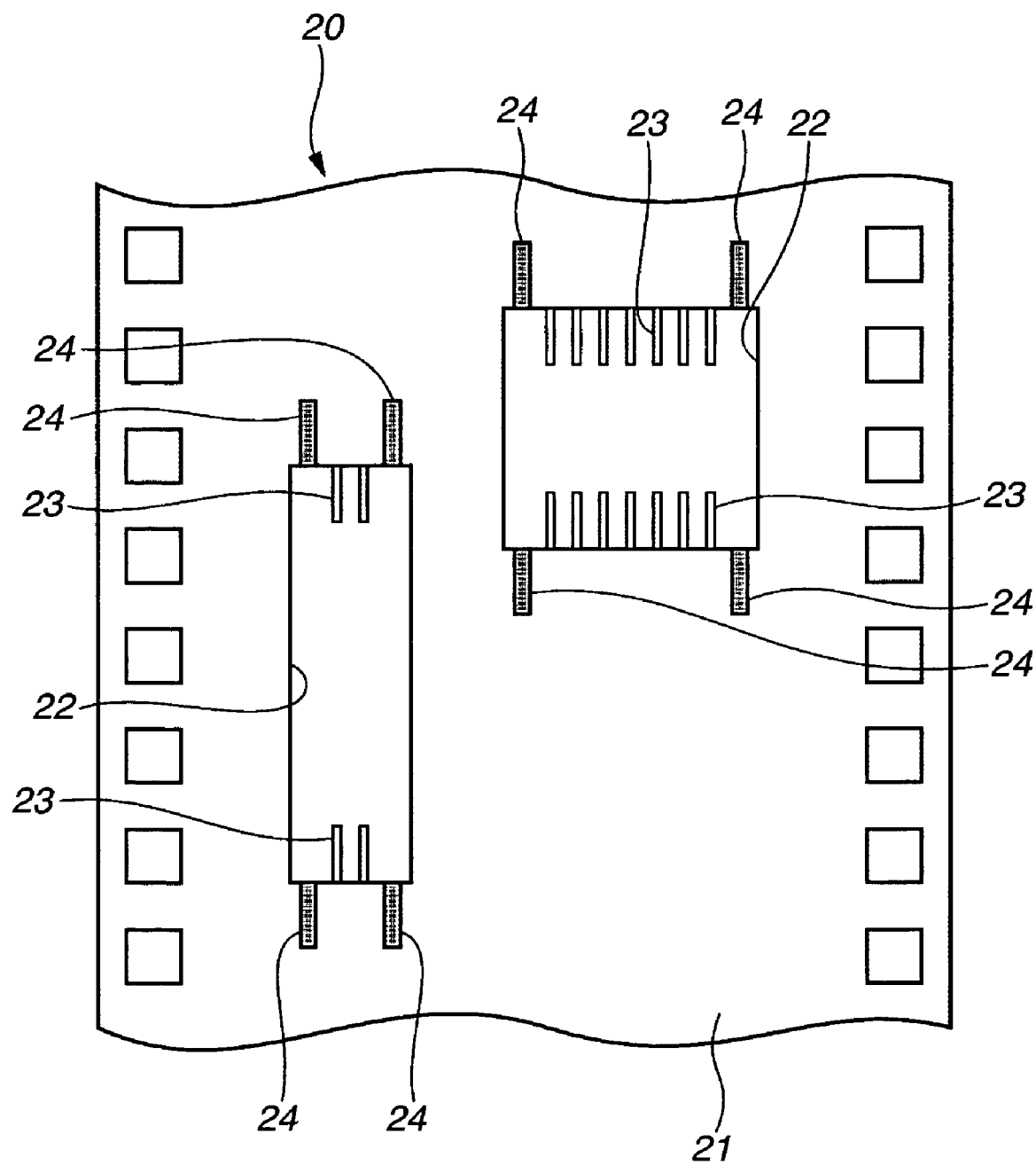
FIG. 2 is a schematic plan view showing an electric wire tape before a recording element substrate is installed.

First, with reference to FIGS. 1 and 2, a first embodiment of the present invention is described. FIG. 1 is a schematic plan view showing the recording element substrates 1a and 1b, which are the main portions of an ink jet recording head, and the electric wire tape 20 on which the recording element substrates are installed. The ink jet recording head is one example of a liquid discharge head. FIG. 2 is a schematic plan view showing the electric wire tape 20 before the recording element substrates 1a and 1b are installed. On the base film 21 configured of an insulating organic resin such as, for example, UPILEX®, Kapton®, the device hole 22 for installing the recording element substrates 1a and 1b, which are generally referred to as a heater board, is formed. Further, the back side of the base film 21 shown in FIG. 2 is provided with a plurality of electric wires. One end of the electric wire constitutes the inner lead 23 which is formed to extend in the opening area of the device hole 22. Another end thereof is an outer lead, which is a wiring part used for connecting to an external wiring substrate (not shown). Further, the surface of the back side of the base film 21 is provided with a protective layer for protecting the electric wire.

The half-cut notch 24, which is the thickness reduction part, is formed along a wiring direction of the inner lead 23 from the side end of the opening of the device hole 22 to the external side thereof. The device hole 22 is an opening formed on the base film 21, and in this opening, the recording element substrates 1a and 1b are arranged. The width, the length, the number, and the position of the half-cut notch 24 are determined so as to obtain desired performance. In more detail, if the inner lead 23 is few in number and relatively short in row, the half-cut notch 24 is provided on one place at an optional end of either left or right of the row of the inner lead or on two places at both left and right ends. If the inner lead 23 is many in number or long in row, the additional appropriate number of half-cut notches are provided on both left and right ends of the row of the inner lead, and on the middle of the row of the inner lead in accordance with the number of the inner lead 23 and the length of the row of the inner lead.

As described above, the half-cut notch 24 is formed in the vicinity of the arrangement of the inner lead 23, thus the effect of thermal expansion of the base film 21 located outside thereof can be alleviated. As a result, the stress applied to the inner lead 23 can be reduced. Further, since the half-cut notch 24 is half cut for reducing the film thickness of the base film 21, even if a conductive liquid such as ink enters there, the liquid does not arrive at the wiring part. Accordingly, the possibility of an occurrence of an electrical shorting or corrosion of the wiring part is removed. Therefore, when designing the layout of the wiring part, it is not necessary to consider the wiring so as to avoid the half-cut notch 24.

In this manner, since the base film 21 is efficiently used, a cost increase due to the increase in size of the electric wire tape 20 can be prevented. Note that, if the half-cut notch 24 is simultaneously formed in a process for forming the device hole 22 or the like on the base film 21, it is not necessary to increase the number of man-hours in a manufacturing process, thus preventing an increase of manufacturing cost.

Figure 3:
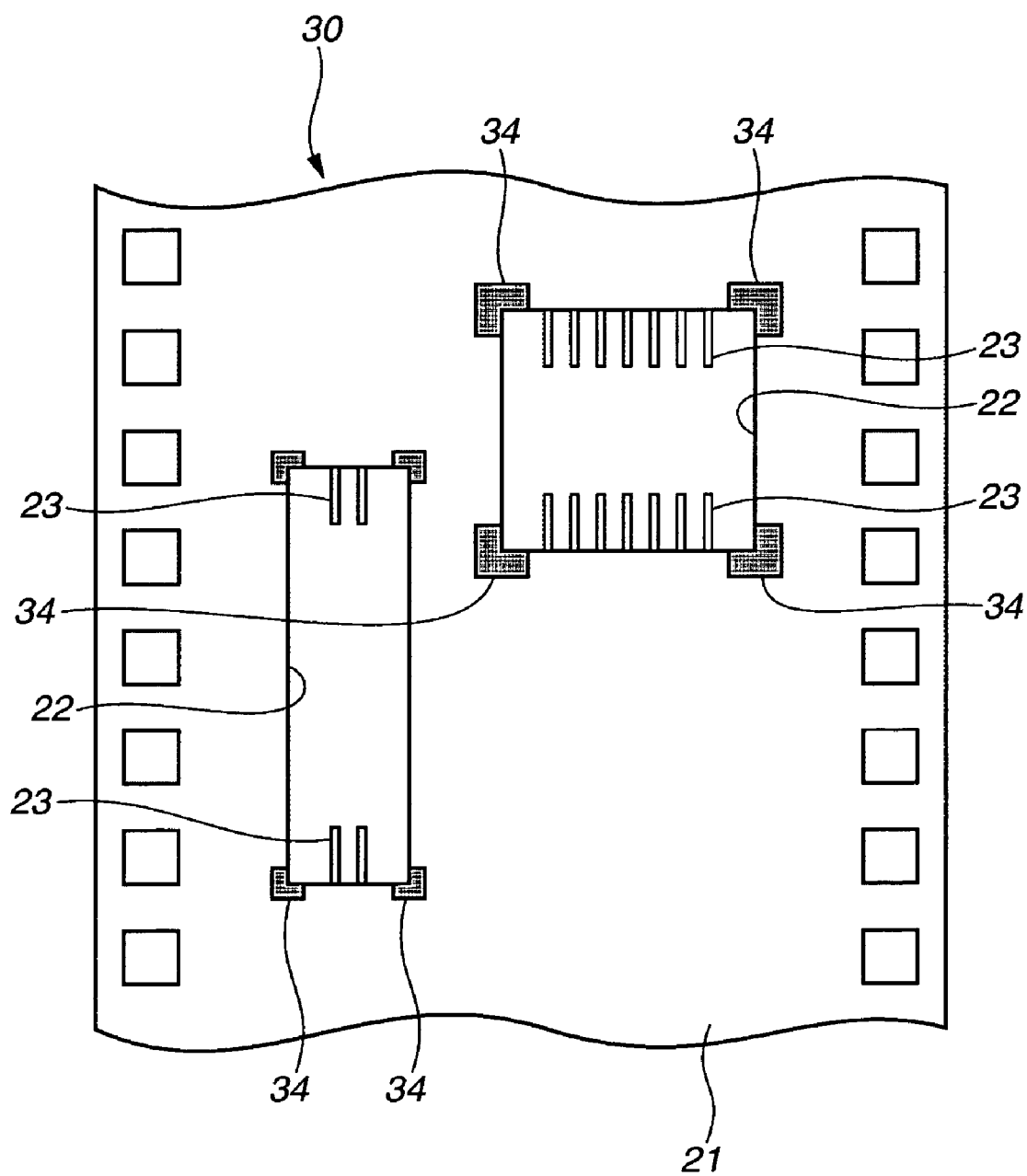
FIG. 3 is a schematic plan view showing an electric wire tape according to the second embodiment of the present invention.

FIG. 3 shows an electric wire tape 30 according to a second embodiment of the present invention. An aspect of the electric wire tape 30 of this embodiment is its effectiveness when stress alleviation is required in the case of adopting a large electric wire tape, increasing the thickness of the base film 21, or the like. According to the present embodiment, a thin film thickness area 34, constituting a thickness reduction part, is provided over a wider range in the vicinity of each corner part of the device hole 22 on the base film 21 by selectively removing a part of the thickness of the upper layer of the base film 21 using etching, laser processing or the like.

Figure 4:
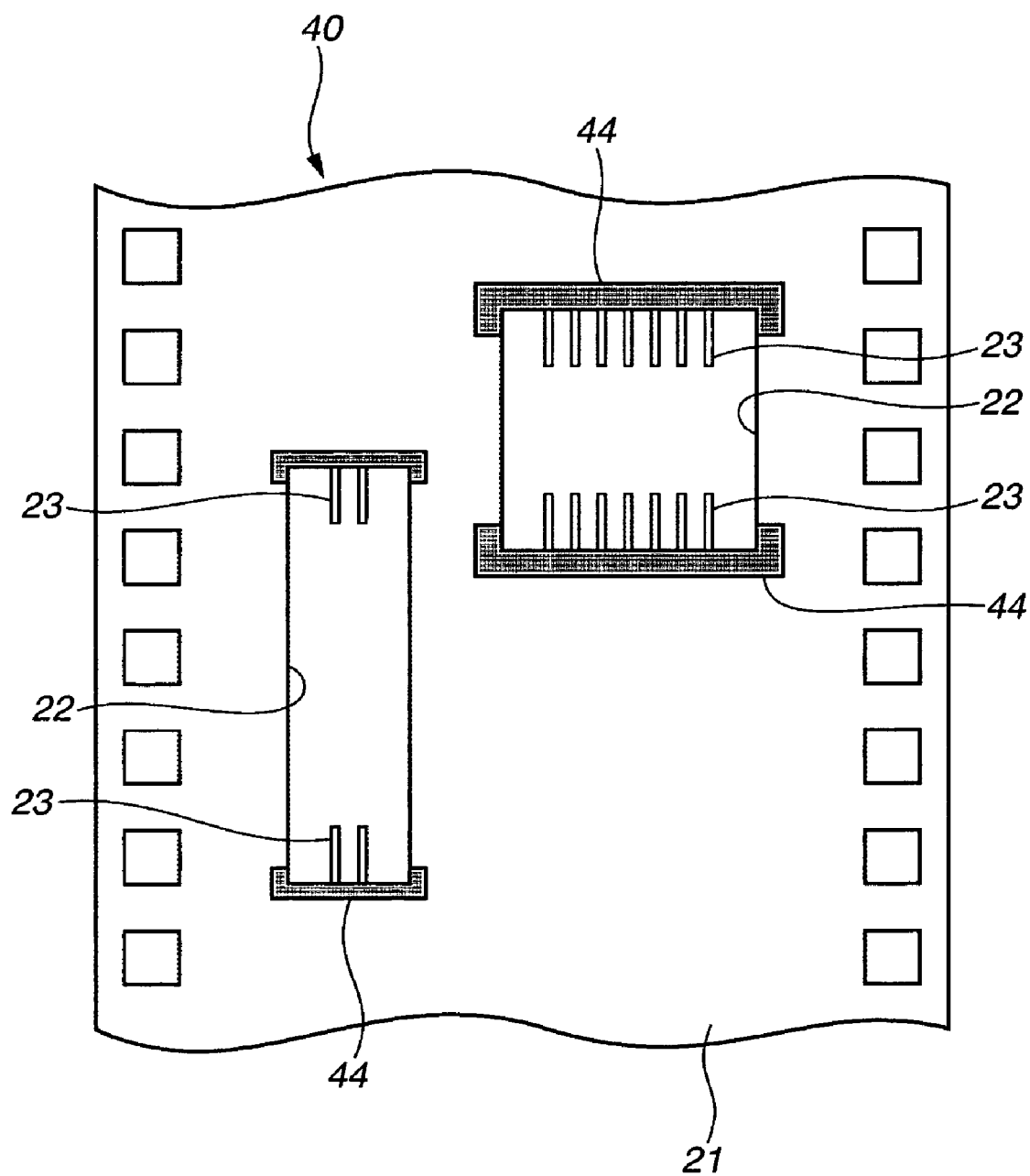
FIG. 4 is a schematic plan view showing an electric wire tape according to the third embodiment of the present invention.

FIG. 4 shows an electric wire tape 40 according to a third embodiment of the present invention. In an entire area where the inner lead 23 is arranged, the upper layer part of the base film 21 is partially removed by etching, laser processing or the like. Thus, an aspect of this embodiment provides a thin film thickness area 44 constituting a thickness reduction part over a much wider range.

The areas 34 and 44 in FIGS. 3 and 4 having a thin film thickness are formed by a widely known method such as etching, but also by laser processing using an excimer laser or the like. The configuration of FIGS. 3 and 4, other than the areas 34 and 44 is similar to FIG. 2 as described above. Therefore in the present embodiment, the same reference numerals are used and their descriptions have been omitted.

Next, taking the electric wire tape in the first embodiment of the present invention as an example, the configuration of an ILB bonding section of the ink jet recording head is described.

As shown in FIG. 1, the recording element substrates 1a and 1b formed of silicone or the like is securely attached and fixed on a support 10 in a highly accurate position. On each of the recording element substrates 1a and 1b, a plurality of electrode pads 2 and bumps 3 composed of aluminum or the like are separately installed. Subsequently, highly accurate positioning is performed so as to make one-to-one correlation between a plurality of inner leads 23 and the electrode pads 2 of the recording element substrates 1a and 1b respectively. The electric wire tape 20 described above is attached and fixed on the support 10. The bump 3 on each electrode pad 2 is a stud bump made of, for example, a gold ball bump or the like. The inner lead 23 and the bump 3 are electrically bonded to each other by a single bonding method which concurrently uses, for example, loading and an ultrasonic vibration while heat is applied to and held at a temperature of 150° C. to 200° C.

The embodiment of the present invention is illustrated using the stud bump. However, the embodiment is not limited to the stud bump. A plating bump produced by various kinds of plating methods, for example, such as electrolytic plating, electroless plating or the like may also be employed. A bumpless method of directly connecting to the electrode pad may also be employed.

When the inner lead 23 is connected to the bump 3, the above-described temperature is held, thus the base film 21 mainly composed of polyimide expands in a direction of widening the device hole 22.

Figure 10:
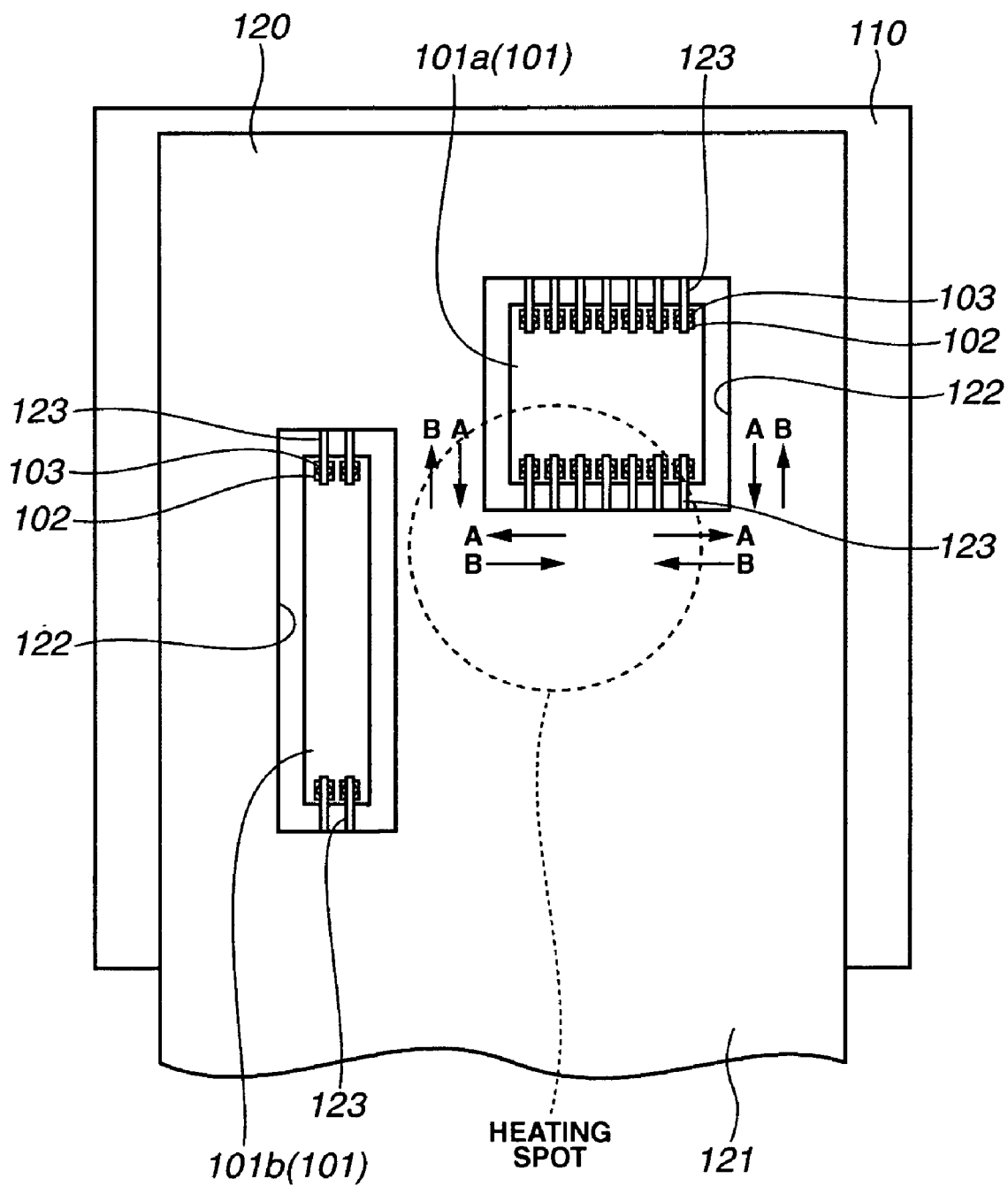
FIG. 10 is a diagram showing an electric wire tape according to a conventional example.
Figure 11A:
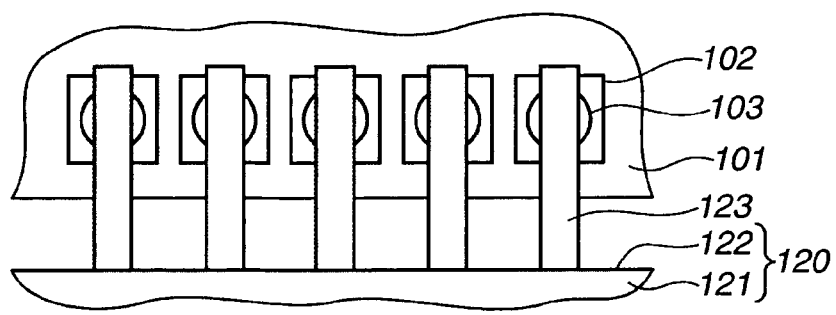
FIGS. 11A to 11D are diagrams illustrating stress caused by expansion and contraction of a base film of an electric wire tape.
Figure 11B:
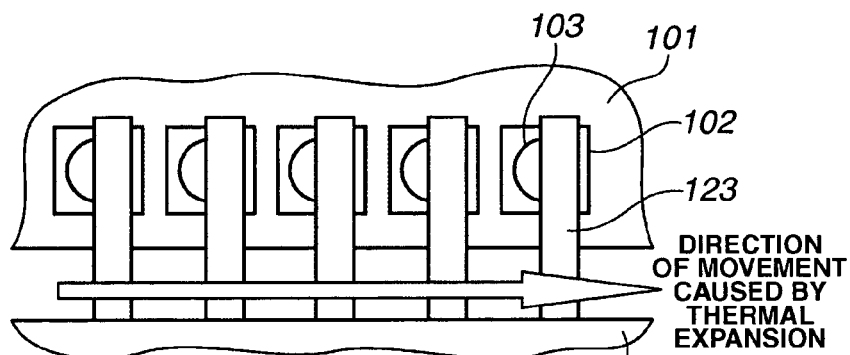
Figure 11C:
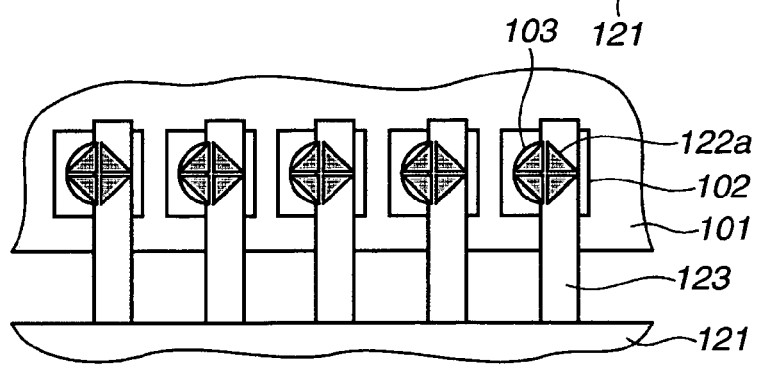
Figure 11D:
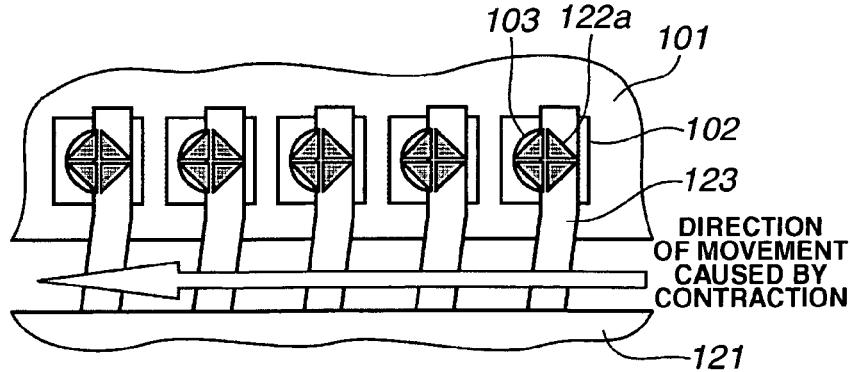

As shown in the embodiment of the present invention, when the recording element substrates 1a and 1b of the ink jet recording head which is the liquid discharge head are installed, heat is applied to the entire face of the support 10 from the back face side thereof. For this reason, a heating spot having a highest temperature is present at the center part of the support 10, as shown in FIG. 10. The temperature decreases toward the outer edge thereof which can easily radiate heat. That is, the closer to the heating spot, the larger a displacement amount of members caused by the application of heat becomes, thus the bonding section is most easily broken.

Therefore, it is effective to provide the half-cut notch 24 as shown in FIGS. 1 and 2, or the area 34 having a thin film thickness as shown in FIG. 3 at least at both ends of the rows of the inner lead of the recording element substrates 1a and 1b. It is also effective if the area 44 having a thin film thickness, which extends along the rows of the inner lead, is provided, as shown in FIG. 4. Since a position of the heating spot varies according to the shape of a heater and a position to be heated, it is important to match the position of the heating spot with the position of the half-cut notch 24 or the area 34 having a thin film thickness as close as possible.

As described above, according to the first, second, and third embodiments of the present invention, due to the half-cut notch 24 or the like formed in the vicinity of the arrangement of the inner lead 23, the effect of thermal expansion on the base film 21 located outside is alleviated. Therefore, the effect on an inner lead arrangement pitch caused by thermal expansion appears only at the area in the vicinity of the row of the inner lead. As a result, a deviation between the inner lead 23 and the electrode pad 2 during bonding becomes small, and a contraction in a cooling process to an ambient temperature after completion of bonding also becomes small. In this manner, the stress applied to the bonding section becomes proportionately small, thus the breakage of the bonding section can be prevented.

In the electric wire tape 20 in FIGS. 1 and 2, the half-cut notches are provided on both ends of the rows of the inner lead. However, in the case where the row of the inner lead becomes longer and the thermal expansion of the area in the vicinity of the row of the inner lead becomes larger, it is more effective if the half-cut notch is additionally provided, for example, in the vicinity of the center of the row of the inner lead to disperse the displacement amount caused by the thermal expansion.

Figure 5:
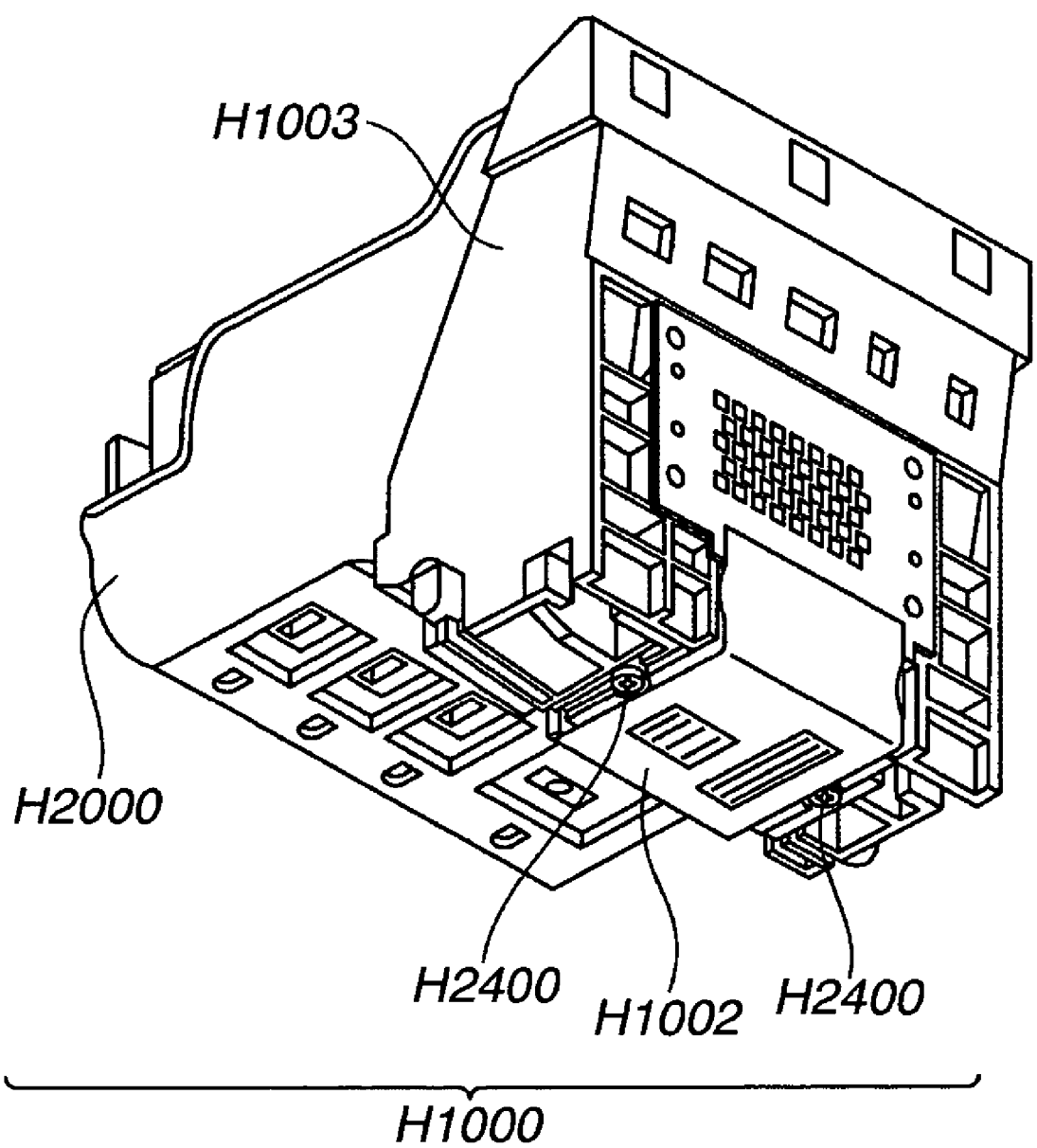
FIG. 5 is a perspective view showing an entire ink jet recording head.
Figure 6:
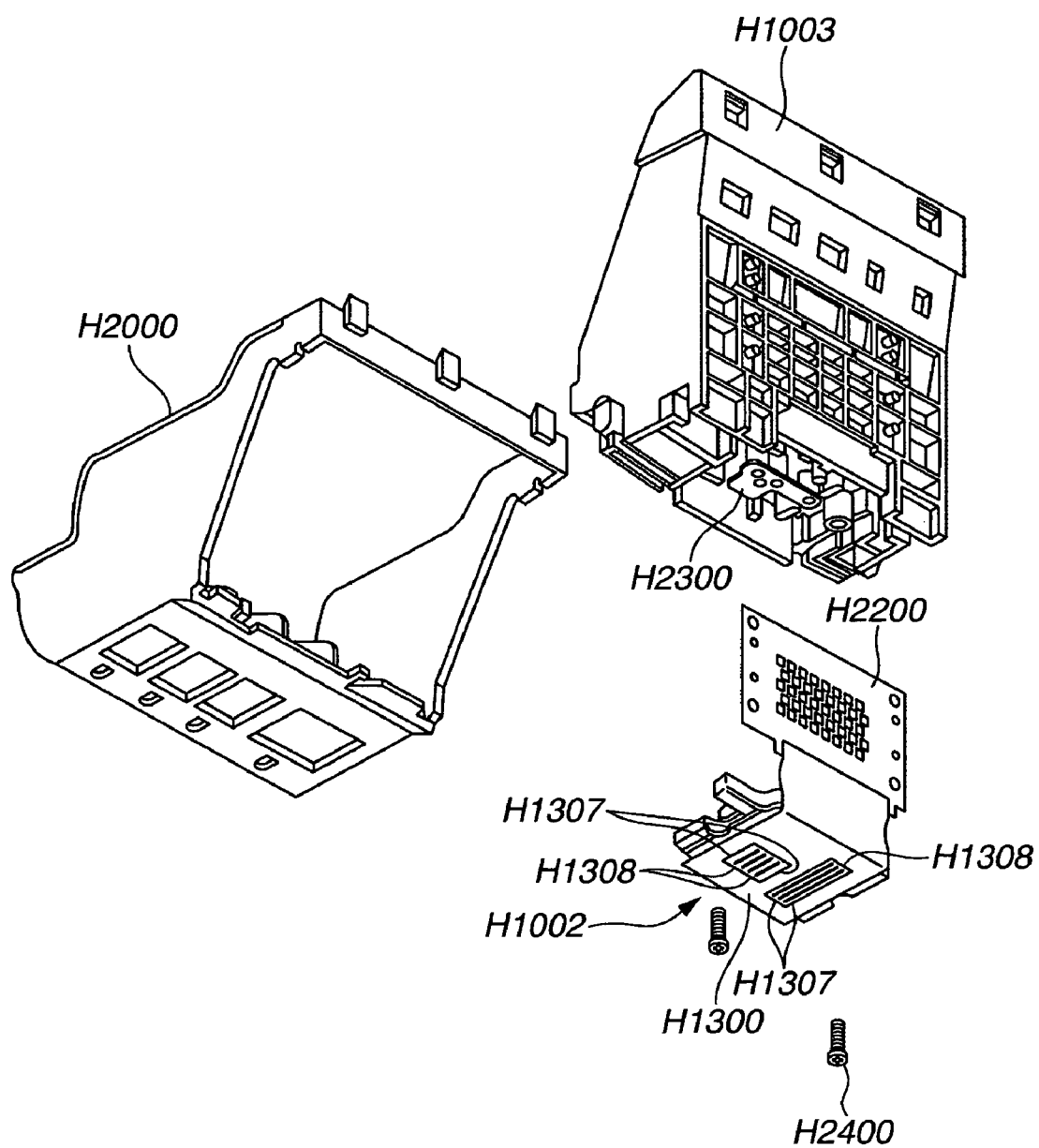
FIG. 6 is an exploded perspective view showing an ink jet recording head in a disassembled state.
Figure 7:
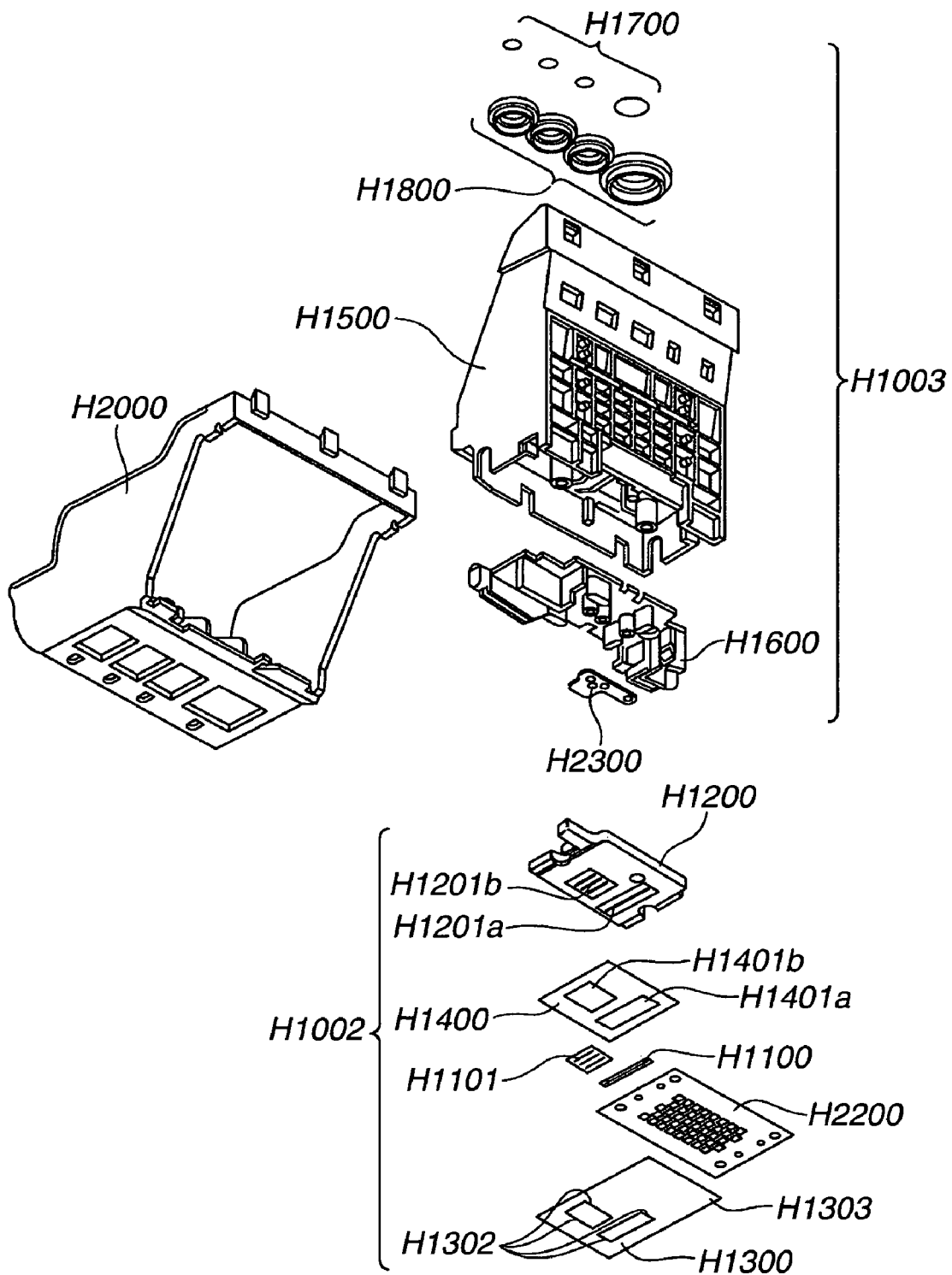
FIG. 7 is an exploded perspective view showing an ink jet recording head in a further minutely disassembled state.

Next, the entire configuration of the liquid discharge head is described with reference to FIGS. 5 to 7. An ink jet recording head H1000, which is the liquid discharge head, includes a recording element unit H1002, an ink supply unit H1003, and a tank holder H2000. As shown in an exploded perspective view in FIG. 7, the recording element unit H1002 includes a first recording element substrate H1100, a second recording element substrate H1101, a first plate H1200, an electric wire tape H1300, an electric contact substrate H2200, and a second plate H1400. The first recording element substrate H1100 and the second recording element substrate H1101 correspond to the recording element substrates 1b and 1a in FIG. 1 respectively, and the electric wire tape H1300 corresponds to the electric wire tape 20 in FIG. 1. Further, the ink supply unit H1003 is made of an ink supply member H1500, a flow path forming member H1600, a joint sealing member H2300, a filter H1700, and a sealing rubber H1800.

Next, the recording element unit H1002 will be described.

The recording element unit H1002 is manufactured through the following processes:
(1) a process for forming a plate bonding body by bonding the first plate to the second plate,
(2) a process for mounting two recording element substrates on the plate bonding body,
(3) a process for aligning an electrode terminal of the electric wire tape with an electrode of each recording element substrate, and bonding the electric wire tape to the above-described plate bonding body,
(4) a process (ILB) for connecting the electrode terminal of the electric wire tape to the electrode of each recording element substrate by inner lead bonding, and
(5) a process for sealing the above-described electrically connecting section.

A detailed description is provided below along the above-described flow of the process.

On the first plate H1200, an ink supply port H1201a for supplying black ink to the first recording element substrate H1100, and an ink supply port H1201b for supplying cyan, magenta and yellow inks to the second recording element substrate H1101 are formed. The second plate H1400 is bonded to the first plate H1200 so as to expose each of ink supply ports H1201a and H1201b of the first plate H1200. The second plate H1400 is bonded to the first plate H1200, and on a portion where ink supply ports H1201a and H1201b are exposed, device holes H1401a and H1401b are formed. The recording element substrates H1100 and H1101 are inserted into the device holes H1401a and H1401b.

The first recording element substrate H1100 and the second recording element substrate H1101 are attached and fixed to the first plate H1200 in the device holes H1401a and H1401b with accurate positioning.

Figure 8:
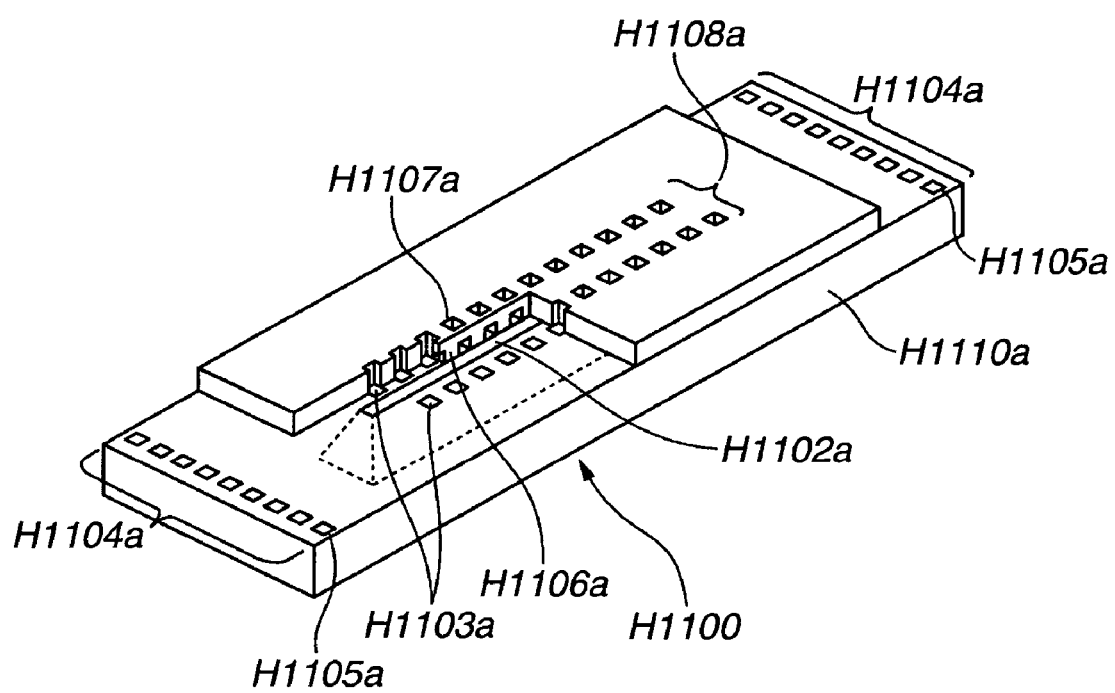
FIG. 8 is a perspective view showing a first recording element substrate in a partially cutaway state.
Figure 9:
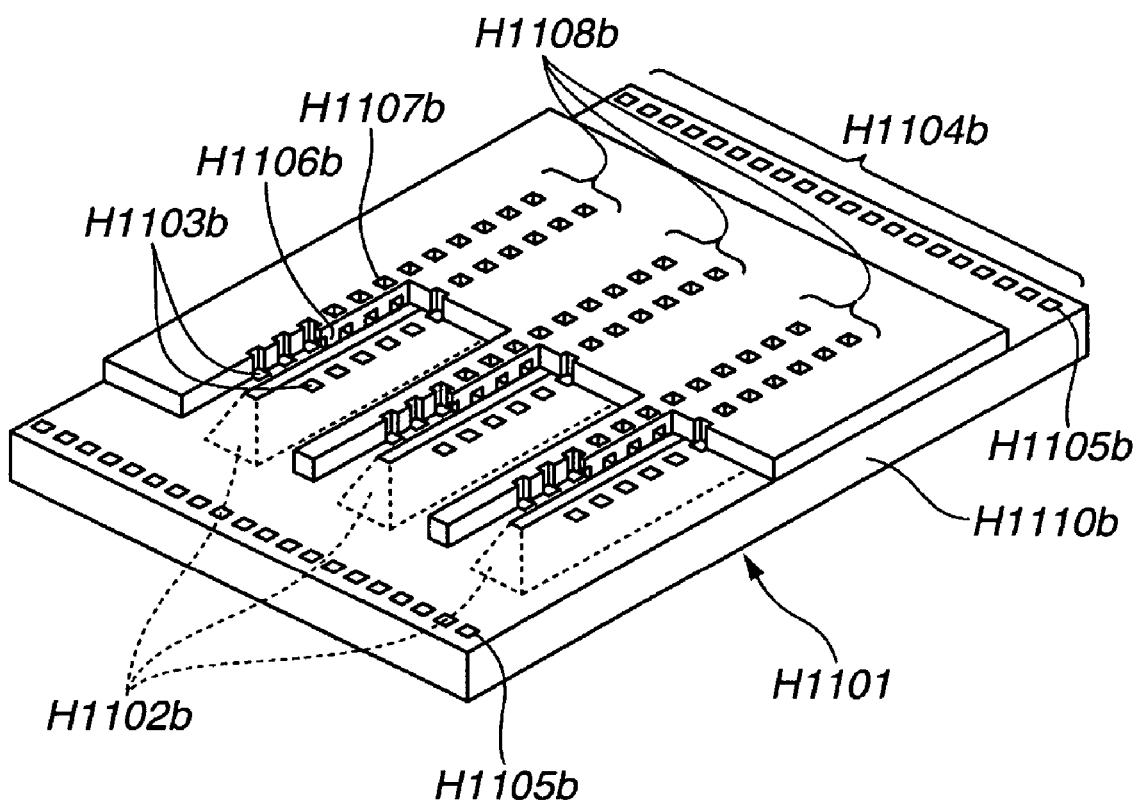
FIG. 9 is a perspective view showing a second recording element substrate in a partially cutaway state.

In FIGS. 8 and 9, the structure of the recording element substrate having a plurality of discharge ports for discharging ink is shown in detail. FIG. 8 shows the first recording element substrate H1100 used for black ink. FIG. 9 shows the second recording element substrate H1101 used for color ink.

In each recording element substrate H1100 (H1101), the ink supply port H1102a (H1102b), and an electrothermal transducers H1103a (H1103b) are formed on a silicon substrate H1110a (H1110b) having a thickness of 0.5 mm to 1 mm. The ink supply port H1102a (H1102b) is made of a through port of a long groove shape serving as an ink flow path. The electrothermal transducers H1103a (H1103b) are disposed in a staggered arrangement in a single row on both sides of the ink supply port H1102a (H1102b). At the position facing the electrothermal transducer H1103a (H1103b), an ink flow path wall H1106a (H1106b) and discharge port rows H1108a (H1108b) made of an ink discharge ports H1107a (H1107b) are formed. On the side of the recording element substrate H1100 (H1101) orthogonal to the rows of the electrothermal transducers H1103a (H1103b), an electrode part H1104a (H1104b) is formed which is connected to the electrothermal transducers H1103a (H1103b) and serves as electrical connection to the external of the substrate. On each electrode part H1104a (H1104b), a gold ball-like bump (stud bump) H1105a (H1105b) is formed by wire bonding.

The electric wire tape H1300 is configured of, as described above, a laminated body including base film, a copper foil wire, a cover film by which protects the copper foil wire, and a solder resist. The base film is formed in a thickness of 25 to 125 μm by, for example, a polyimide resin. On the other hand, the copper foil wire has a thickness of 35 μm, and includes a trace of a predetermined shape for connecting two recording element substrates H1100 and H1101, and the electric contact substrate H2200. A part of the electric wire tape H1300, where the recording element substrate is incorporated, is formed as the device hole having a roughly similar shape to the device holes H1401a and H1401b. On both sides of the device hole corresponding to the electrode part H1104a (H1104b) of the recording element substrate H1100 (H1101), the row of electric terminals H1302 with the surface plated with gold is disposed as a connecting terminal. The cover film side of the electric wire tape H1300 is fixed on the surface of the second plate H1400 through an adhesive layer of a thermosetting epoxy resin. The base film of the electric wire tape H1300 provides a smooth cap face on which a cap member of the recording element unit H1002 or the like abuts. The electric connection between the electric wire tape H1300 and two recording element substrates H1100 and H1101 is performed, as described above, by the inner lead bonding (ILB) between the electric terminal H1302 of the electric wire tape H1300 and a bump H1105a (H1105b). The bump H1105a (H1105b) is provided beforehand on the electrode part H1104a (H1104b) of each recording element substrate H1100 (H1101).

In the electrically connecting section after completion of the ILB, if the connecting portion is exposed, a droplet (ink droplet) scattered from the discharge port or a liquid (ink) leaping up from the surface of a recording medium, such as paper sheet, can adhere to the electrode part, thus the electrode part or the ground metal thereof is often corroded. Accordingly, the electrode is covered and sealed with a sealant such as an epoxy resin or the like which is excellent in sealing properties and ion barrier properties. By performing this sealing, the ink flow path communicating from the ink supply ports H1201a and H1201b to each discharge port H1107a (H1107b) is formed.

In this sealing, as a sealant covering the surrounding of each recording element substrate, a material having high flowability and also high resilience was selected which does not apply stress such as contraction in hardening or the like to each recording element substrate after completion of hardening, and is designated as a first sealant H1307. On the other hand, as a sealant covering the electrically connecting section, a second sealant H1308 was selected. The second sealant H1308 has abrasion resistance to a rubber-made wiper blade which periodically wipes the ink droplet adhering to the face of an orifice, and rigidity which prevents the peeling phenomenon in the case where recording paper is brought into contact with the sealant.

After this, the electric terminal connecting part H1303 which is the electricity input side of the electric wire tape H1300 and the electric contact substrate H2200 for transferring an electrical signal from a recording device main body are connected by an ACF (Anisotropic Conductive film), and are covered with the above-described sealant or the like. The recording element unit H1002 and the ink supply unit H1003 manufactured in such a manner are fastened and fixed with a screw H2400 at two places via a joint sealing member H2300, and thereafter, a tank holder H2000 is incorporated, thus the ink jet recording head H1000 is completed.

With respect to the above-described ink jet recording head, the printing head was illustrated into which black and color are integrated. However, a similar manufacturing method can be employed in the ink jet recording head in which black and color are separately handled and one recording element substrate is attached to one ink jet recording head.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2004-293194 filed Oct. 6, 2004, which is hereby incorporated by reference herein in its entirety.

What is claimed is:

1. A liquid discharge head, comprising
a support;
a recording element substrate configured to discharge liquid, the recording element substrate being supported by the support; and
a flexible wiring board supported by the support, the flexible wiring board comprising:
   a first resin layer having an opening for providing the recording element board and bonded to the support;
   a second resin layer having an opening for providing the recording element board and formed on a back side of the first resin layer;
   a plurality of wiring parts formed between the first resin layer and the second resin layer; and
   a plurality of inner leads formed by extending ends of the plurality of wiring parts from the opening and connected to the recording element board,
   wherein, in a periphery of the opening of the second resin layer, a thickness of the second resin layer in an end area of arrangement of the plurality of inner leads is smaller than a thickness of the second resin layer in an area other than the end area.

* * * * *